(12) United States Patent
Akram et al.

(10) Patent No.: US 7,919,348 B2
(45) Date of Patent: Apr. 5, 2011

(54) METHODS FOR PROTECTING IMAGING ELEMENTS OF PHOTOIMAGERS DURING BACK SIDE PROCESSING

(75) Inventors: Salman Akram, Boise, ID (US); Kyle K. Kirby, Eagle, ID (US)

(73) Assignee: Aptina Imaging Corporation, George Town (KY)

( * ) Notice: Subject to any disclaimer, the term of this patent is extended or adjusted under 35 U.S.C. 154(b) by 270 days.

(21) Appl. No.: 12/139,068

(22) Filed: Jun. 13, 2008

(65) Prior Publication Data

US 2009/0309176 A1    Dec. 17, 2009

(51) Int. Cl.
*H01L 21/00*    (2006.01)
(52) U.S. Cl. ....... 438/64; 438/48; 438/65; 257/E21.499; 257/E31.117
(58) Field of Classification Search .................... 438/65, 438/48
See application file for complete search history.

(56) References Cited

U.S. PATENT DOCUMENTS

| | | | |
|---|---|---|---|
| 6,465,330 B1 | 10/2002 | Takahashi et al. | |
| 7,288,757 B2 * | 10/2007 | Farnworth et al. | 250/239 |
| 2005/0275750 A1 | 12/2005 | Akram et al. | |
| 2005/0285154 A1 | 12/2005 | Akram et al. | |
| 2006/0043599 A1 | 3/2006 | Akram et al. | |
| 2006/0151847 A1 * | 7/2006 | Kwon et al. | 257/433 |
| 2006/0199363 A1 | 9/2006 | Kirby et al. | |
| 2008/0290438 A1 * | 11/2008 | Weng et al. | 257/434 |
| 2008/0304821 A1 * | 12/2008 | Jeung et al. | 396/529 |

* cited by examiner

*Primary Examiner* — Thanh Nguyen

(57) ABSTRACT

Methods for processing photoimagers include forming one or more protective layers over the image sensing elements of a photoimager. Protective layers may facilitate thinning of the substrates of photoimagers, as well as prevent contamination of the image sensing elements and associated optical features during back side processing of the photoimagers. Blind vias, which extend from the back side of a photoimager to bond pads carried by an active surface of the photoimager, may be formed through the back side. The vias may be filled with conductive material and, optionally, redistribution circuitry may be fabricated over the back side of the photoimager. Photoimagers including features at result from such processes are also disclosed.

16 Claims, 11 Drawing Sheets

METHODS FOR PROTECTING IMAGING ELEMENTS OF PHOTOIMAGERS DURING BACK SIDE PROCESSING

FIELD OF THE INVENTION

Embodiments of the invention relate generally to methods for fabricating photoimagers and, more specifically, to methods for protecting imaging features of a photoimager while back side processing of the photoimager is effected, as well as photoimagers and systems including photoimagers.

BACKGROUND OF RELATED ART

Semiconductor photoimagers, which are also commonly referred to more simply as "photoimagers," are used in a variety of different types of electronic devices, including digital cameras, wireless devices with picture capabilities (e.g., cell phones, so-called "personal digital assistants" (PDAs), etc.), IP security cameras, intelligent vehicle systems, and medical devices. The use of photoimagers has increased as they have been made smaller and capable of producing clearer images with higher pixel resolution.

Examples of photoimagers include the more conventional charge-coupled devices (CCDs), as well as state-of-the-art complementary metal-oxide-semiconductor (CMOS) imagers. CMOS imagers are becoming increasingly more popular because they offer several advantages over CCDs, including lower manufacturing costs, lower power consumption, ease of system design, smaller dimensions, and on-chip feature sets. Many of the desirable features of CMOS imagers may be attributed to the use of semiconductor device fabrication technology and equipment.

Conventionally, photoimagers have been wirebonded to carriers, or carrier substrates, such as circuit boards. As a relatively large portion of the active surface is dedicated to image sensing, all of the bond pads of a photoimager are confined to the periphery. As a consequence, the periphery of the photoimager may be densely populated with bond pads and their corresponding bond wires. Further, the bond wires consume valuable real estate on the carrier substrate.

Through-wafer interconnects (TWIs), or conductive vias, have been developed to alleviate many of the problems associated with the bond pads of conventional photoimagers and the bond wires that have been used to electrically connect conventionally configured photoimagers to carriers. By rerouting bond pads to the back side of a photoimager, through-wafer interconnects enable the placement of glass covers over photoimagers, eliminate the need for bond wires, reduce required real-estate, increase device density, and enable the use of wafer-level packaging methods. Conventional through-wafer interconnects, however, like wire bonding, require front-side processing, which may contaminate the image sensing elements of a photoimager.

The back side of the substrate upon which a photoimager is fabricated may be ground or etched to reduce the thickness of the photoimager and, thus, to reduce the volume of space consumed by the photoimager. Conventional grinding processes have been used to reduce the thicknesses of photoimagers to as low as about 100 μm. Photoimagers that are thinner than about 100 μm have not been possible, however, due to warpage, bowing, cracking, and breakage that occurs when back grinding processes are used to reduce wafer thicknesses below about 100 μm.

There are needs for processes and features to protect image sensing elements of a photoimager as the photoimager is subjected to processing from its back side.

BRIEF DESCRIPTION OF THE SEVERAL VIEWS OF THE DRAWINGS

While the specification concludes with claims particularly pointing out and distinctly claiming that which is regarded as the present invention, the advantages of various embodiments of the invention may be more readily ascertained from the following description, when read in conjunction with the accompanying drawings, in which;

The illustrations presented herein are not meant to be actual views of any particular photoimager, but are merely idealized representations that are employed to depict and facilitate description of embodiments of the present invention. Additionally, elements common between figures may retain the same numerical designation.

DETAILED DESCRIPTION OF THE INVENTION

The present invention, in several embodiments, includes methods for packaging photoimagers including methods of forming conductive vias in photoimagers, as well as methods of relocating back side contacts on intermediate photoimager structures, which are also referred to herein as "photoimagers" for the sake of simplicity. The present invention also includes embodiments of photoimagers.

In various embodiments, the present invention includes methods of processing photoimagers. Such a method includes providing a photoimager with an active surface and a back side. One or more protective layers, or a protective element, is disposed over at least light sensing regions of the active surface of the photoimager. At least one electrically conductive via is formed through the photoimager, from the back side of the photoimager to a contact carried by the active surface of the photoimager. In some embodiments, conductive traces may also be formed on the back side of the photoimager to reroute the connection pattern dictated by the conductive vias. In addition, the present invention includes various embodiments of photoimagers.

Figure 1:
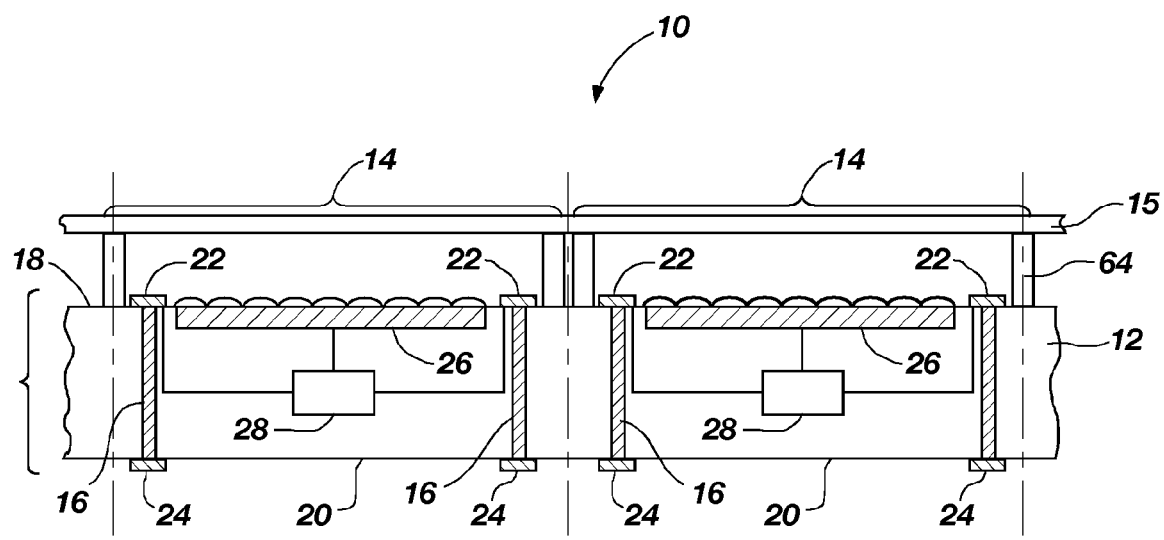
FIG. 1 schematically illustrates a cross-sectional view of a portion of an embodiment of a photoimager with a plurality of conductive vias according to embodiments of the present invention.

FIG. 1 illustrates a cross-sectional view of a portion of a fabrication substrate 10 that includes a plurality of photoimagers 14 that have been fabricated on a generally planar substrate 12. The substrate 12 has an active surface 18 (also termed a "front side" in terms of processing) and an opposing back side 20. The substrate 12 may include any suitable fabrication substrate. As used herein, the term "fabrication substrate" includes, without limitation, full or partial semiconductor (e.g., silicon, gallium arsenide, indium phosphide, etc.) wafers, a silicon-on-insulator (SOI) type substrate (e.g., silicon-on-ceramic (SOC), silicon-on-glass (SOG), silicon-on-sapphire (SOS), etc.), and the like. The photoimagers 14 may be arranged in a die pattern on the substrate 12. Individual photoimagers 14 may include an image sensor array 26 connected to an integrated circuit 28 and conductive terminals 22 (e.g., bond pads). Additionally, optical features 15 (e.g., lenses, glass, filters, etc.) may be formed directly over image sensor array 26 or supported thereover by standoffs 64 or similar features. The image sensors of the image sensor array 26 may include CCD image sensors, CMOS image sensors, or other semiconductor devices for sensing and capturing images. Conductive vias 16, or through-wafer interconnects (TWIs), are formed in the substrate 12 and extend at least partially between the active surface 18 of the substrate 12 and the back side 20 of the substrate 12. The conductive vias 16 electrically connect conductive terminals 22 on the active surface 18 of the substrate 12 to back side conductive terminals 24 (e.g., bond pads) on the back side 20 of the substrate 12. The back side conductive terminals 24 are arranged in a connection pattern that facilitates attachment of the photoimagers 14 to other electrical devices directly over correspondingly arranged contacts, and may facilitate wafer-level packaging of the photoimager 14. The hack side conductive terminals 24 also enable the photoimagers 14 to be attached directly to an external device without an interposer substrate, eliminate the need to form wire bonds on the conductive terminals 22, or perform other front side processing. This enables the optical features 15 to be formed on the photoimager 10 at the wafer level, enables the imagers to be tested from the back side, and results in smaller packages.

Various embodiments of methods for forming the conductive vias 16, an embodiment of which is shown in the photoimagers of FIG. 1, are described below with reference to FIGS. 2-28.

Figure 2:
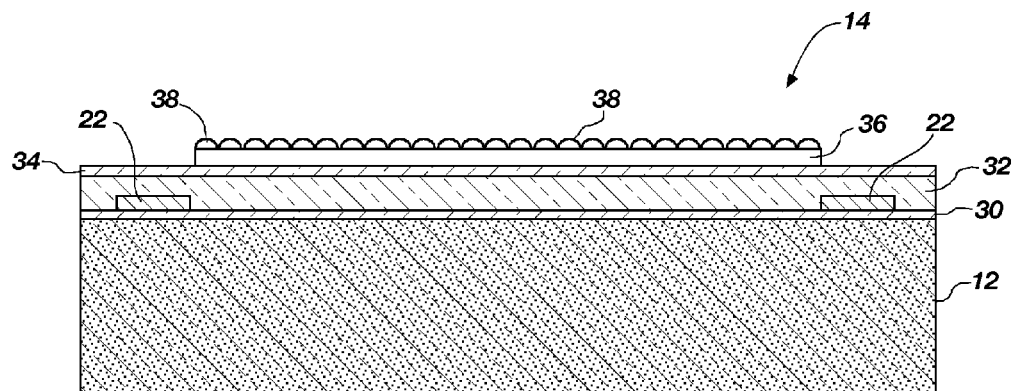
FIGS. 2-4 depict a process by which imaging features of a photoimager may be protected in accordance with embodiments of the present invention.

FIG. 2 is a side cross-sectional view of the photoimager 14 shown in FIG. 1, with a single photoimager 14 including two conductive terminals 22 illustrated for the sake of simplicity. The photoimager 14 includes a substrate 12, which is shown as a unitary structure in FIGS. 2-28 merely for the sake of simplicity. The photoimager 14 includes a first dielectric layer 30 formed on the active surface 18 of the substrate 12. Bond pads 22, which are carried by first dielectric layer 30, and portions of first dielectric layer 30, may be covered by a second dielectric layer 32. In embodiments where the first and second dielectric layers 30, 32 are formed over image sensing elements of the photoimager 14, they may include optically transparent materials such as silicon dioxide ($SiO_2$), silicon nitride ($Si_3N_4$), a Parylene™ polymer, polyimide, or any other suitable material by known processes. The first dielectric layer 30 may have a different composition than the second dielectric layer 32 or it may have the same composition as, or a substantially similar composition to, the second dielectric layer 32. One or more passivation layers 34 may be formed over the second dielectric layer 32. The passivation layer or layers 34 may include one or more of the materials previously described in relation to the dielectric layers 30 and 32, or any other suitable material.

Conventional packaging methods sometimes employ front side processing techniques, for example, to etch or otherwise remove any layers covering the conductive terminals, to attach bond wires to bond pads, or to etch conductive terminals to form through-wafer interconnects. Because conventional packaging methods require front side processing, they are sometimes performed prior to the formation of a color-filter array and microlenses over the image-sensing regions of the photoimager. As a result, the image-sensing regions of the photoimager may remain unprotected during such processing. As seen in FIG. 2, the photoimager 14 includes a color-filter array (CFA) 36 and microlenses 38 formed over image-sensing regions at the active surface 18 of the substrate 12. Forming the blind vias from the back side 20 of the photoimager 14 (as described in detail below) enables formation of the CFA 36 and the microlenses 38 on a substantially planar surface that lacks any contamination that may otherwise occur during via-forming processes and avoids the need for any further front side processing of the photoimager 14.

Figure 3:
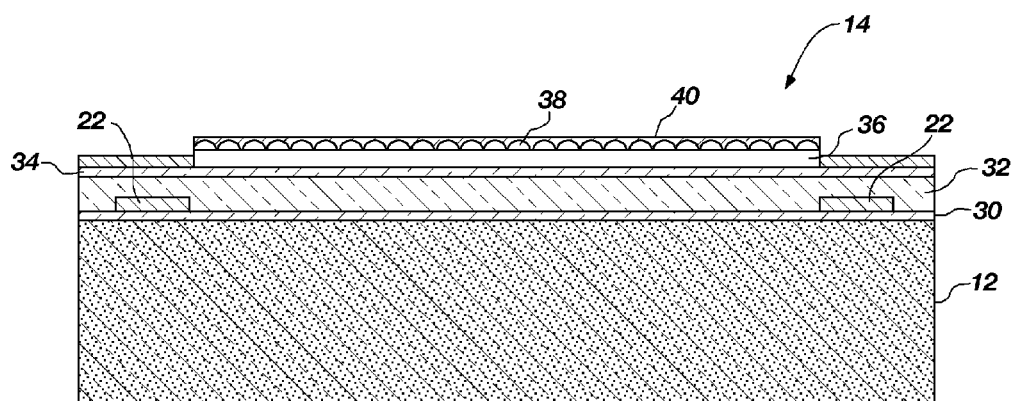
Figure 4:
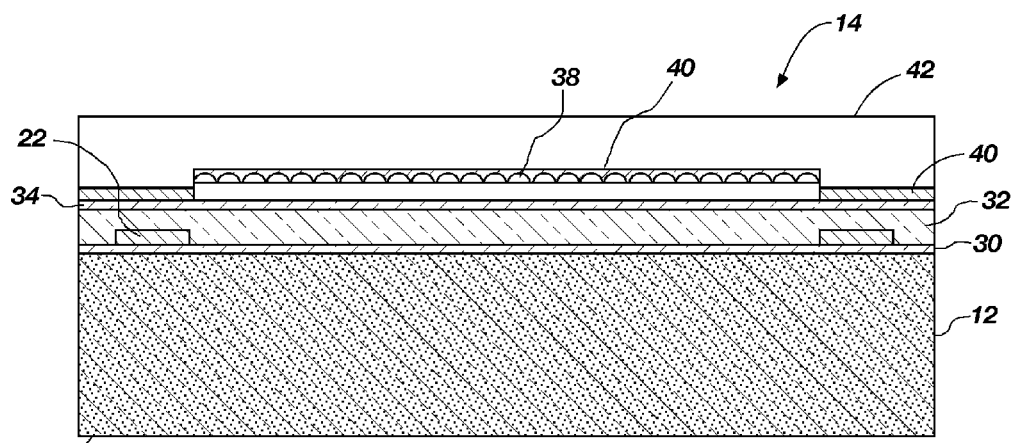

Referring to FIGS. 3 and 4, a release layer 40 and, subsequently, a protective layer 42 are applied over microlenses 38 and the exposed surface of the second dielectric layer 34. The release layer 40 and the protective layer 42 serve to protect the microlenses 38 and the CFA 36 during the blind via formation process. The release layer 40 and the protective layer 42 also provide the photoimager 14 and, particularly, the substrate 12, with support and rigidity during the fabrication process. The release layer 40 may act as a buffer between the protective layer 42 and the microlenses 38, as well as function as a buffer to assist in the removal of the protective layer 42. The release layer 40 may include an oxide, a low-temperature oxide (LTO) (e.g., a low-silane oxide, etc.), a tape, an epoxy, or any other suitable materials. The release layer 40 may include one or more of layers of such materials. The protective layer 42 may include a thick, hard material such as a polymer, a metal, an oxide, a ceramic, or other suitable material.

In some embodiments, the release layer 40 may include a first sublayer 40a (not shown) formed directly on the microlenses 38 and a second sublayer 40b (not shown) formed over the first sublayer 40a. The first sublayer 40a may protect the microlenses 38 and act as an oxide cap for the microlenses 38. The first sublayer 40a may include a 2000 Å thick layer of a LTO, such as low-silane oxide. The second sublayer 40b may include a polymer or other material and serve as a buffer between the first sublayer 40a and the protective layer 42. In other embodiments, the release layer 40 may include a single layer or more than two sublayers.

Figure 5:
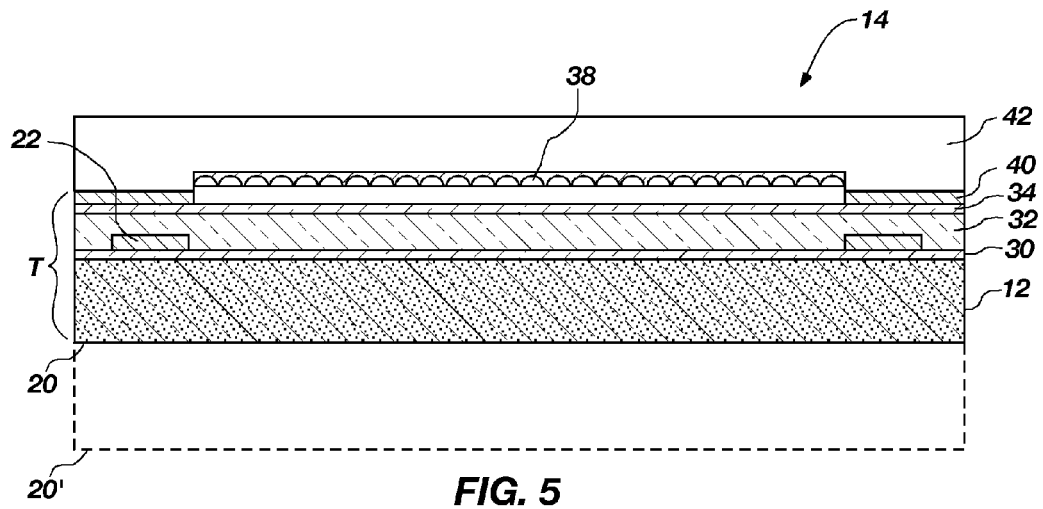
FIG. 5 shows thinning of a semiconductor substrate of a photoimager in embodiments of the present invention.

Referring to FIG. 5, once the release layer 40 and the protective layer 42 have been formed, the substrate 12 may be thinned to a thickness T. This is performed by removing material from the back side 20' of the substrate 12, represented by the dashed line, to form back side 20. The substrate 12 may be thinned using known processes, such as chemical-mechanical planarization or chemical-mechanical polishing (CMP) processes, grinding processes, wet etch processes, or any other suitable material removal process. The protective layer 42 serges both to support the substrate 12 and also provide rigidity, which enables the substrate 12 to be reduced to a thicknesses smaller than the thicknesses that are attainable with conventional photoimager fabrication methods (e.g., about 100 µm), without causing warping or other damage to the substrate 12. In some embodiments, the thickness of the substrate 12 may be reduced to about 50 µm or less.

Figure 6:
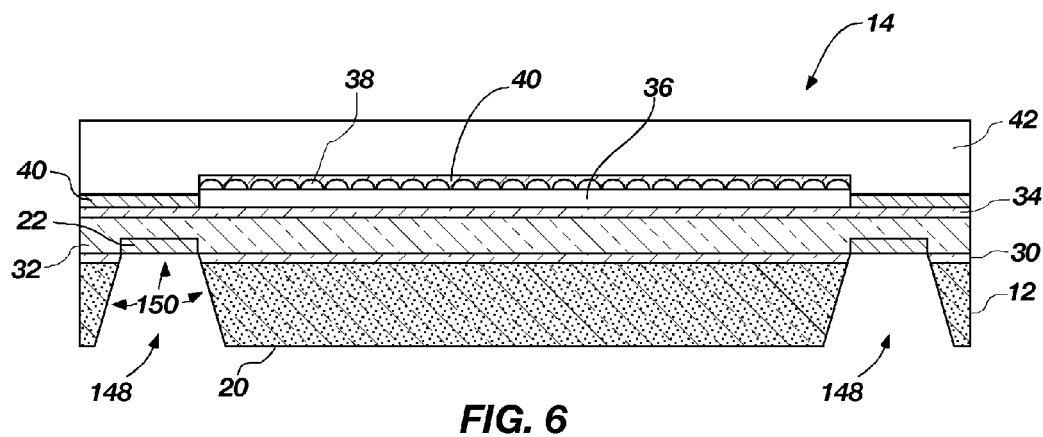
FIGS. 6 and 7 show an embodiment of a method for forming and passivating surfaces of blind via holes in the back side of a photoimager.

Referring to FIG. 6, once the release layer or layers 40 and the protective layer 42 have been formed on the photoimager 14 and the substrate 12 has been thinned, blind vias 148 may be formed in the photoimager 14. The blind vias 148 are formed in the back side 20 of the substrate 12 and extend through the substrate 12 and the first dielectric layer 30 to expose the bond pads 22.

As used herein, the term "blind via" includes a hole or aperture that extends only partially through the substrate 12 or is otherwise closed at one end. In the embodiment shown in FIG. 10, the blind vias 48 extend through the substrate 12 to the conductive terminals 22. The blind vias 48 are formed from the back side, or in other words they are formed in the substrate 12 from back side 20 that opposes the active surface 18 on which the CFA 36 and the microlenses 38 are formed.

The blind vias 148 may be formed using a laser ablation process (e.g., laser drilling, etc.). In embodiments where a laser ablation process is used to form blind vias 148, slag or other contaminants generated by the laser ablation process, as well as damaged substrate material, such as damaged silicon in a so-called "heat affected zone," may be removed by known processes. Chemical agents that do not attack the metal of the bond pads 22 may be used. In a specific embodiment, 6% tetramethylammonium hydroxide (TMAHl): propylene glycol may be used to remove slag or other contaminants and, thus, to clean the photoimager 14.

Figure 7:
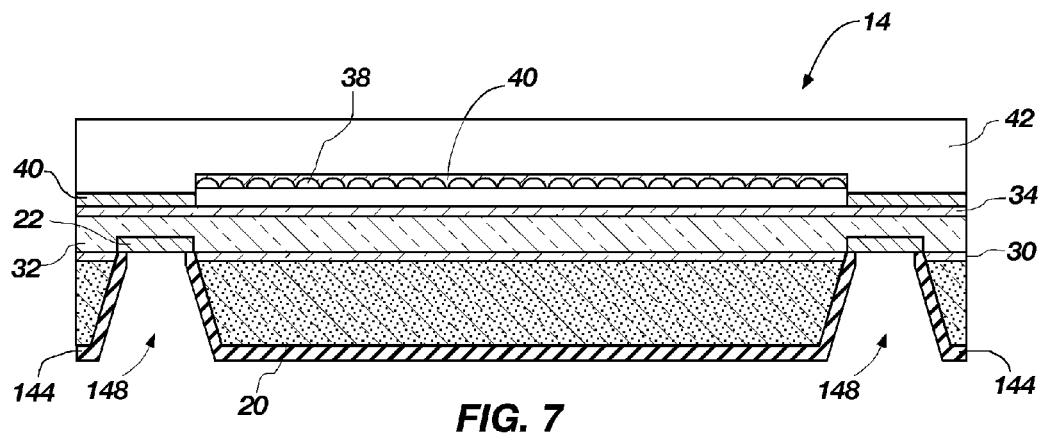

Referring next to FIG. 7, a back side dielectric layer 144 may be deposited over the back side 20 of the photoimager 14, over one or more surfaces 150 (FIG. 6) of blind via 148 and, optionally, over the surfaces of the bond pads 22 that are exposed to the blind vias 148. The back side dielectric layer 144 may include, without limitation, silicon dioxide (SiO$_2$), silicon nitride (Si$_3$N$_4$), a Parylene™ polymer, polyimide, or my other suitable material and by known processes.

In embodiments where the back side dielectric layer 144 covers the portions of bond pads 22 that are exposed to the blind vias 148, the back side dielectric layer 144 may be subsequently removed from at least a portion of each bond pad 22. Known, suitable etching processes may be employed in this regard.

As an alternative to the via-forming process embodiments described in reference to FIGS. 6 and 7, blind vias 48 may be etched into the substrate 12. Embodiments of methods for etching blind vias 48 into the back side 12 of substrate 12 are shown in FIGS. 8-11.

Figure 8:
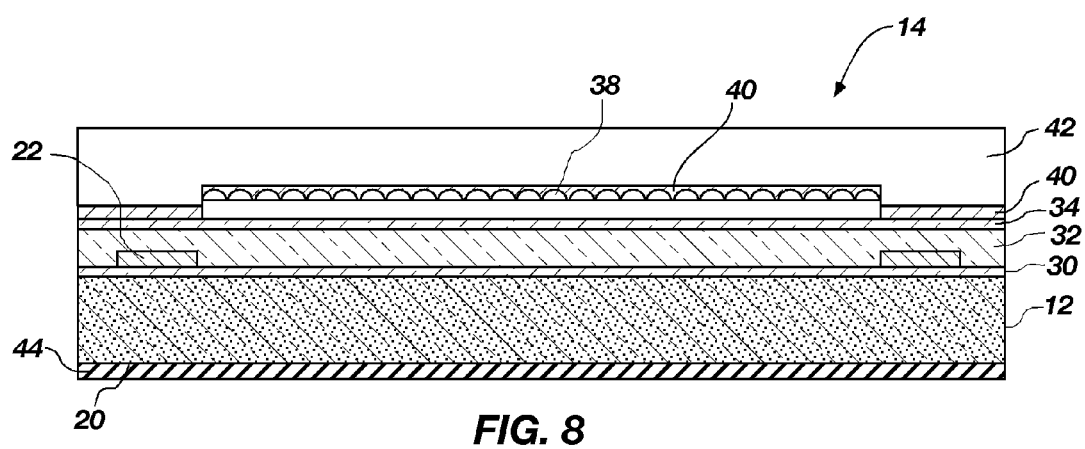
FIGS. 8-13 depict another embodiment of a method for forming and passivating blind via holes in the back side of a photoimager.

Referring to FIG. 8, after the substrate 12 is thinned, a hard mask layer 44, from which a photomask 46 (FIG. 9) will be formed, may be applied over the back side 20 of the substrate 12. The hard mask layer 44 may include, without limitation, silicon dioxide (SiO$_2$), silicon nitride (Si$_3$N$_4$), a Parylene™ polymer, polyimide, or any other suitable material.

Figure 9:
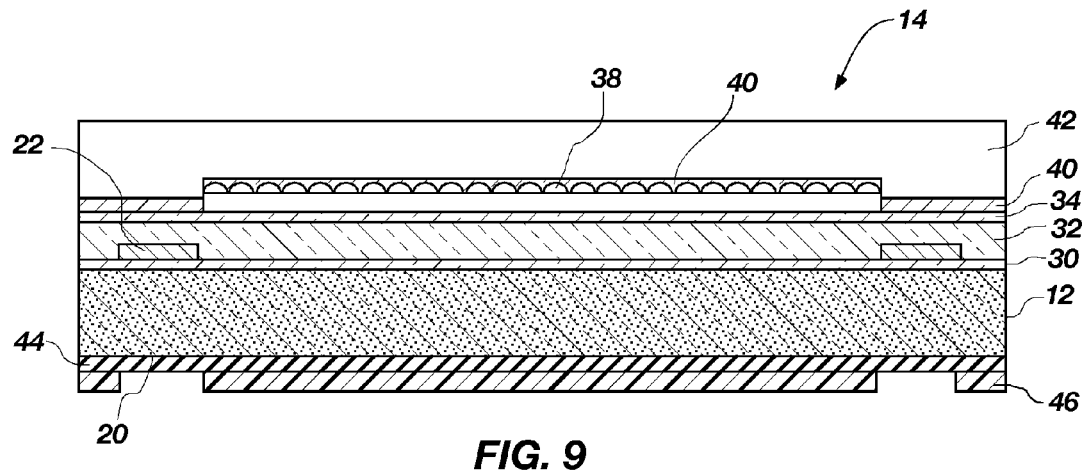

Referring next to FIG. 9, a photomask 46 may be formed over the hard mask layer 44, as shown in FIG. 9, using methods known in the art. The photomask 46 may include a layer of resist or photoresist, which may be patterned to expose regions of the hard mask layer 44 that are in-line with (through the substrate 12) the bond pads 22. Material of the hard mask layer 44 may be removed through the photomask 46 (e.g., with suitable wet or dry etchants) to form a hard mask from the hard mask layer 44.

Figure 10:
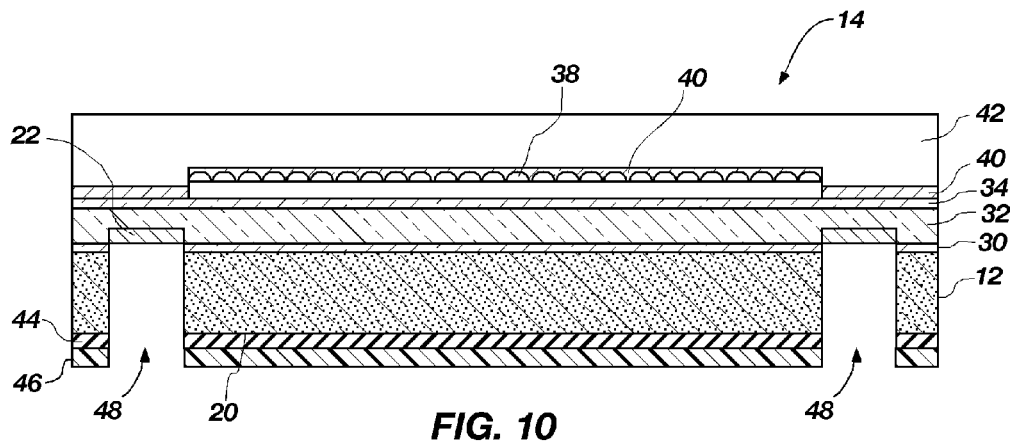
Figure 11:
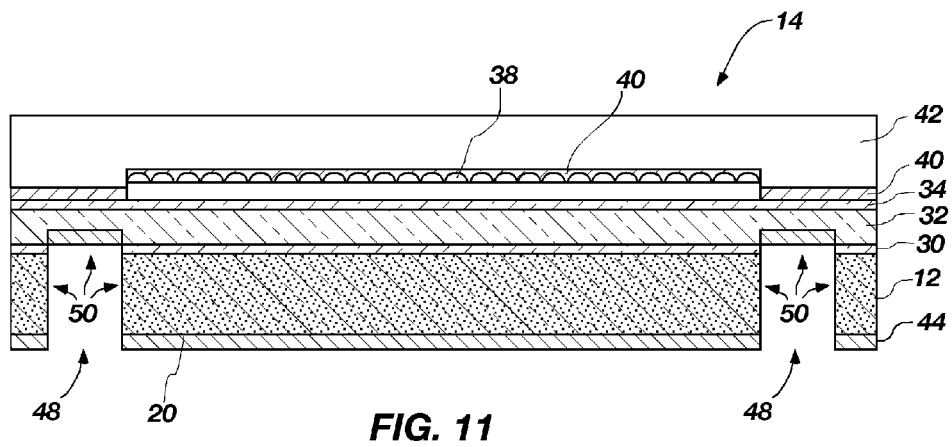

Referring to FIG. 10, using the hard mask layer 44, blind vias 48 may be formed through at least a portion of the substrate 12. The blind vias 48 may be formed through the hard mask layer 44 by known, suitable etching processes. In some embodiments, a wet chemical etch may be performed. In other embodiments, dry (reactive ion) etch processes may be used. Etching may be conducted with etchants that remove the material or materials of substrate 12 with selectivity over other features, such as the material or materials of the first dielectric layer 30. As such, the first dielectric layer 30 may act as an etch stop. A subsequent etch process may be used to remove portions of the first dielectric layer 30 that are adjacent to the bond pads 22, thereby exposing the bond pads 22. The subsequent etch process may selectively remove material of the first dielectric layer 30 with selectivity over the material or materials of the substrate 12 and over the material or materials of the bond pads 22. In a further embodiment, the blind vias 48 may be formed in a single etch process, in which the materials of the substrate 12 and the first dielectric layer 30 are removed with the same etchant or combination of etchants. Once the blind vias 48 have been formed, the photomask 46 may be removed, as shown in FIG. 11.

Figure 12:
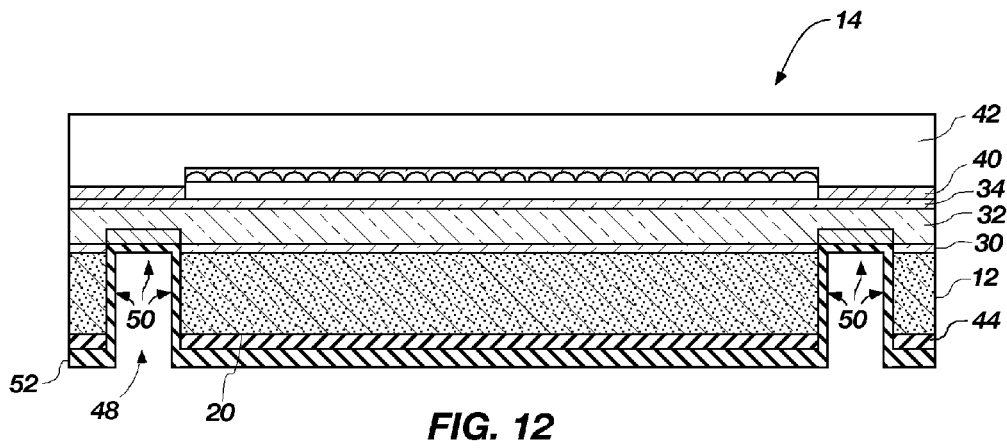

Referring next to FIG. 12, a dielectric liner 52 may be deposited over the back side 20 of the substrate 12 (e.g., directly on the back side 20, on at least a portion of the hard mask layer 44, on at least a portion of the back side dielectric layer 144 (FIG. 7), over one or more surfaces 50 of the substrate 12, and on conductive terminals 22 located within the blind vias 48). The dielectric liner 52 may include, but is not limited to including, silicon dioxide (SiO$_2$), silicon nitride (Si$_3$N$_4$), a Parylene™ polymer, polyimide, or any other suitable material. The dielectric liner 52 may, however, be formed from a different material than the hard mask layer 44 or the back side dielectric layer 144 (FIG. 7). Forming the dielectric liner 52 from a different material than the hard mask layer 44 or the back side dielectric layer 144 facilitates etching of the dielectric liner 52 with selectivity over a material of the hard mask layer 44 or back side dielectric layer 144.

Figure 13:
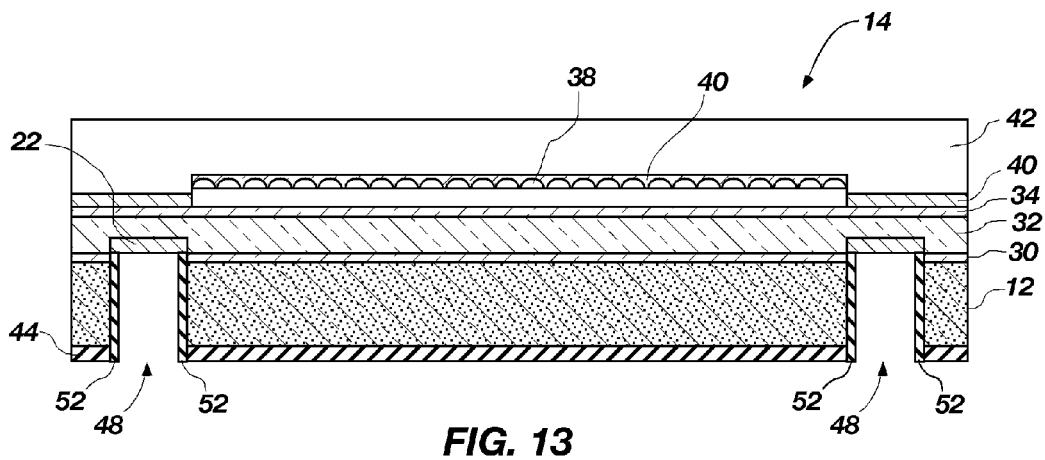

Referring next to FIG. 13, portions of the dielectric liner 52 may be removed from at least a portion of each of the conductive terminals 22 and the hard mask layer 44 or back side dielectric layer (FIG. 7) covering the back side 20 of the substrate 12. The dielectric liner 52 may be removed using a spacer etch, CMP, or another suitable, known removal process. While removing portions of the dielectric liner 52 from the conductive terminals 22, other portions of the dielectric liner 52 may remain, lining the sidewalls of the blind vias 48, as shown in FIG. 13, to electrically isolate the substrate from conductive materials subsequently introduced into the blind vias 48.

Turning now to FIGS. 14-20, a conductive material may be introduced into the blind vias 48 (see, e.g., FIG. 13), 148 (see, e.g., FIG. 7) in any suitable manner known in the art.

In some embodiments, the conductive material (e.g., nickel, copper, or other metals) may be introduced directly onto the dielectric liners 52 within the blind vias 48, 148 by known plating or deposition processes. In embodiments where a conductive material 56, such as a conductive film, remains on the back side 20 of the substrate 12 after conductive material 56 has been introduced into the blind vias 48, 148, the conductive material 56 on the back side 20 of the substrate 12 may be removed from the back side 20 or patterned. Conductive material may be removed from the entire back side by known processes, such as by CMP or wet etch processes.

Figure 15:
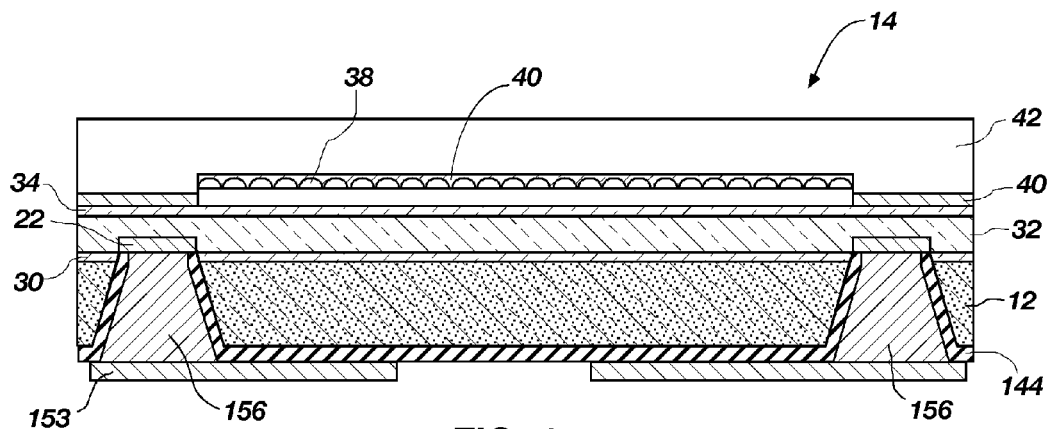
FIGS. 15 and 16 illustrate an embodiment of a method for forming a redistribution layer on the back side of the photoimager shown in FIG. 14.

In some embodiments, it may be desirable to form a redistribution layer (RDL) 153, or "redistribution circuitry" including conductive traces and an array of back side conductive terminals, over the back side 20 of the substrate, as shown in FIG. 15. An RDL 153 relocates the connection pattern of the photoimager from that dictated by the back side terminals 156, which are aligned with the blind vias 48, 148, to new locations that facilitate electrical connection of the photoimager 14 with other electrical devices having contacts arranged in complementary connection patterns.

The RDL 153 may be formed as known in the art. In some embodiments, the RDL 153 may be formed by masking and etching a conductive film, or portions thereof remaining on the back side 20 of the substrate 12 following the introduction of conductive material 54 into the blind vias 48, 148. In other embodiments, the RDL 153 may be fabricated by masking and etching a separately deposited layer of conductive material. In yet other embodiments, the RDL 153 may be fabricated by performing conductive traces and terminals and applying them to the back side 20 of substrate 12.

Figure 16:
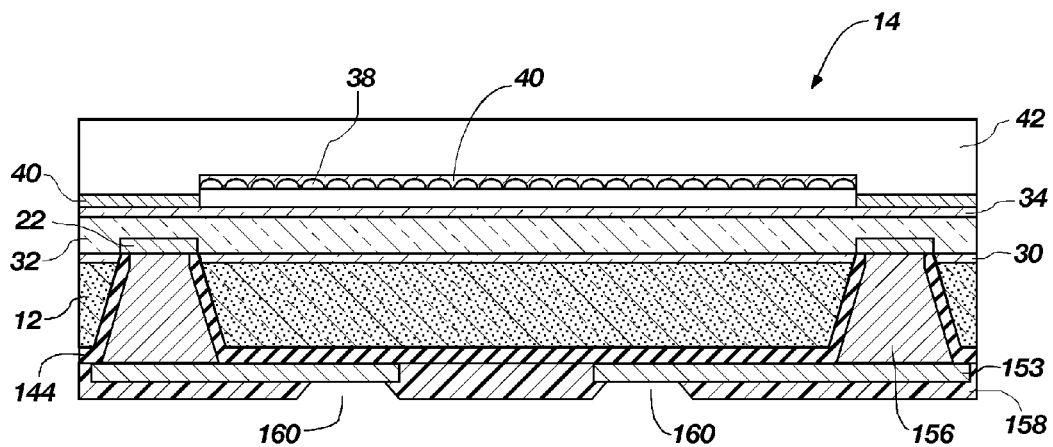

Once the RDL 153 has been formed, a protective layer 158, which comprises dielectric material, may be formed over the RDL 153, as shown in FIG. 16. The protective layer 158 may be formed from silicon dioxide ($SiO_2$), silicon nitride ($Si_3N_4$), a Parylene™ polymer, polyimide, or any other suitable material and subsequently patterned to expose the contacts of the RDL 153. In addition to covering portions of the RDL 153, the protective layer 158 may partially or substantially fill any voids remaining within the blind vias 48, 148 (FIG. 7).

Figure 17:
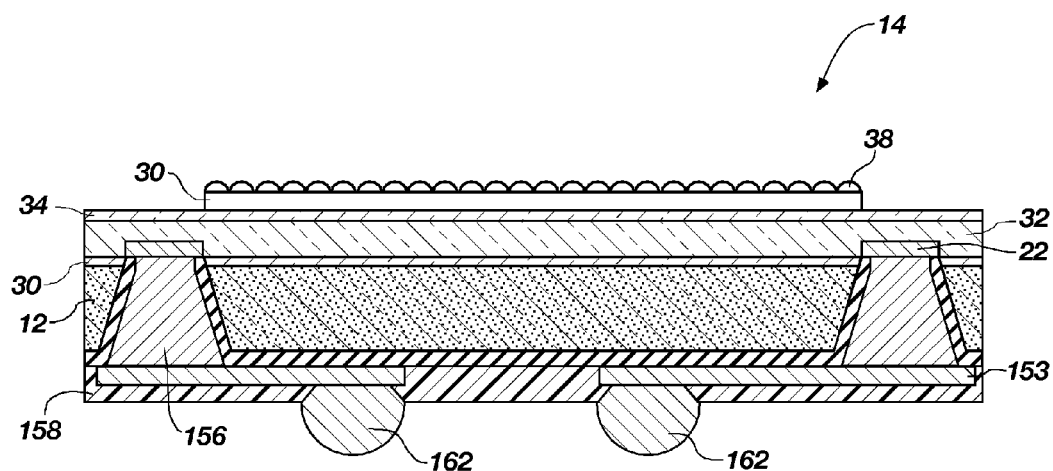
FIG. 17 depicts the application of discrete conductive structures to redistributed contacts on the back side of a photoimager according to various embodiments of the present invention.

As shown in FIG. 17, solder balls or other discrete conductive structures 162 (e.g., balls, bumps, studs, columns, pillars, pins, or the like) may then be formed on or secured to the contacts of RDL 153 that are exposed through the protective layer 158, as known in the art.

In other embodiments, the dielectric liners 52 within the blind vias 48, 148 (FIG. 7) may be coated with a film or seed layer of conductive material before additional conductive material is introduced into the blind vias 48, 148. Embodiments of the manner in which such a conductive film 54 may be formed are described in reference to FIGS. 18 and 19.

Figure 18:
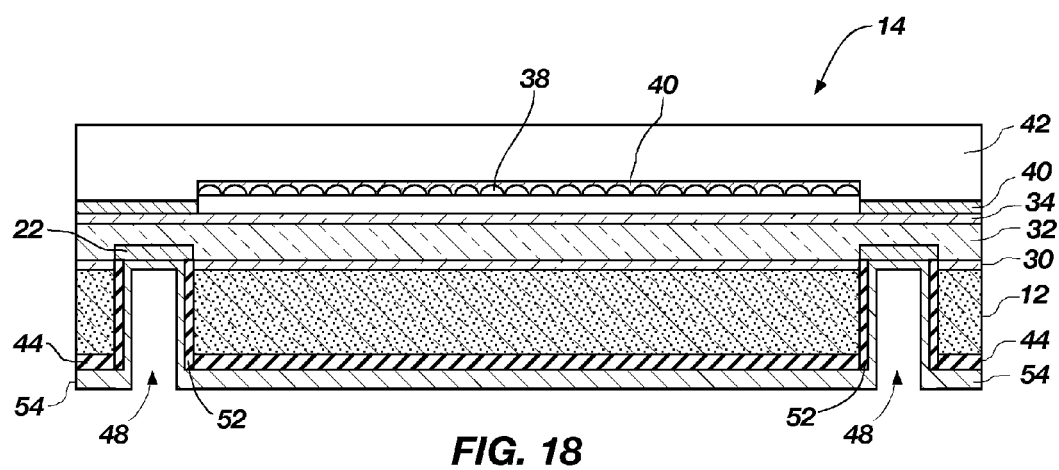
FIGS. 18-20 show another embodiment of the present invention comprising a method for introducing conductive material into blind via holes of a photoimager.

Initially, as illustrated in FIG. 18, a conductive film 54 may be formed (e.g., by plating or deposition processes) over at least a portion of the hard mask layer 44, including over the dielectric liner 52 that coats the surfaces of the blind vias 48, 148 (FIG. 7), and over the portions of the bond pads 22 that are exposed to the blind vias 48, 148. The conductive film 54 may include one or more layers of metal or metal alloys. In embodiments of the invention, titanium nitride (TiN), tantalum nitride (TaN), tungsten (W), a tungsten alloy, aluminum (Al), copper (CU), nickel (Ni) or other suitable metals, may be deposited or plated onto the dielectric liner 52 using suitable processes that are known in the art. The sputtered metal may comprise the entire conductive liner 52 or it may act as a seed layer for plating one or more additional metals, such as Ni, Cu, Au, or other suitable metals. The material for the conductive film 54 may be selected so the conductive film 54 acts as a barrier to prevent the migration of matter (i.e., atoms, molecules, etc.), such as copper, therethrough. In specific embodiments, the conductive film 54 may include a stack of metals, including tantalum on the dielectric liner 52, tantalum nitride (TaN) on the tantalum, and copper (Cu) on the tantalum nitride. In other specific embodiments, the conductive film 54 may include a layer of copper on a layer of tungsten or a layer of tantalum. The conductive film 54 may be electrically conductive and may be in electrical contact with the bond pad 22.

Figure 19:
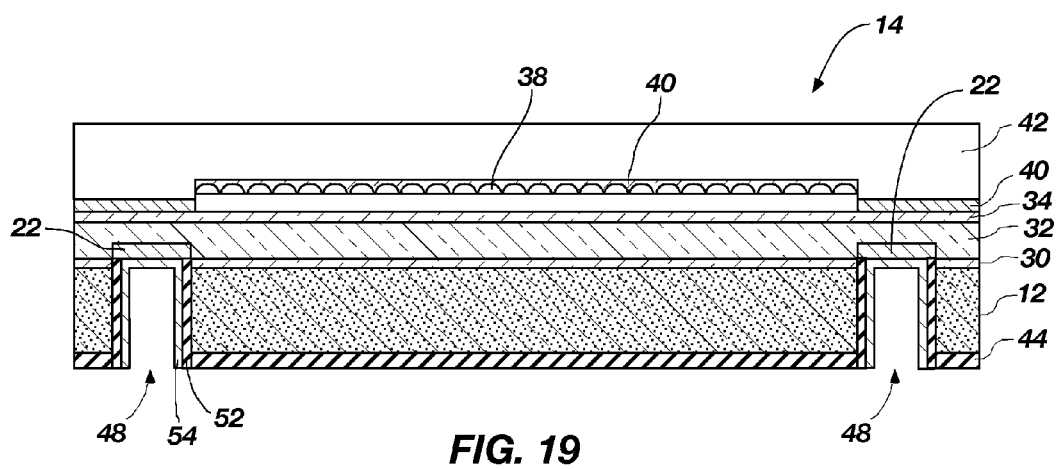

Referring next to FIG. 19, the conductive film 54 (FIG. 18) may be masked and etched, as known in the art, to form electrically isolated conductive liners 54' and, thus, to electrically isolate each bond pad 22 from other bond pads 22. In some embodiments, the conductive film 54 may be removed from locations over the back side 20 of the substrate 12, leaving only conductive liners 54' within the blind vias 48, 148 (FIG. 7). In other embodiments, portions of the conductive film 54 may remain over the back side 20 of the substrate 12 to form part of an RDL 153 (see, e.g., FIGS. 15-17).

Figure 14:
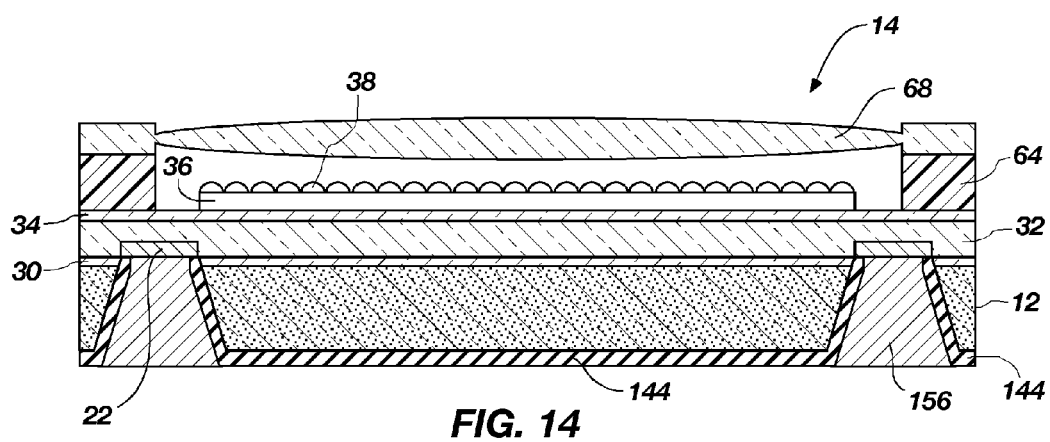
FIG. 14 illustrates an embodiment of a method for introducing conductive material into blind via holes of a photoimager.

In some embodiments further conductive material may be introduced into the blind vias 48, 148 (FIG. 7) in the manner described in reference to FIG. 14. Of course, an RDL 153 and protective layer 158 may also be formed in the manner described in reference to FIGS. 15 and 16.

Figure 20:
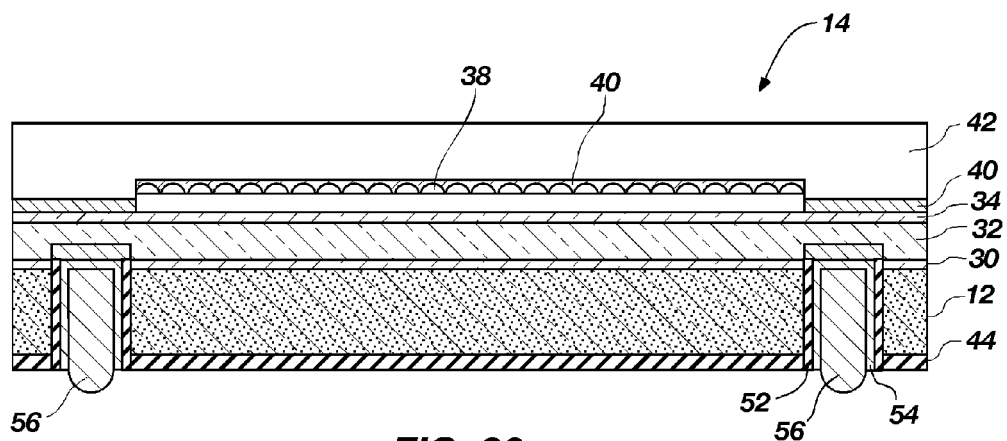

Another embodiment of a technique for introducing further conductive material into the blind vias 48, 148 (FIG. 7) is shown in FIG. 20. In some embodiments of the present invention, a conductive filler material, such as a solder, a molten metal material, conductor-filled polymers, conductive polymers or the like may be introduced into the blind vias 48, 148 to form back side conductive terminals 156. Any suitable process, depending, of course, upon the type of conductive material to be introduced into the blind vias 48, 148, may be used. In embodiments where the conductive material is solder or molten metal, a solder wave process may be used, or solder or metal paste may be forced into the blind vias 48, 148. As shown, the back side terminals 156 resulting from such processes may protrude from the back side 20 of the substrate 12, or they may be substantially coplanar with a surface of a dielectric layer 144 on the back side 20, or be recessed relative to the back side 20.

Of course, an RDL 153 and corresponding protective layer 158 may be formed over the back side 20 of the substrate 12 in the manner described in reference to FIGS. 14-16. If the back side conductive terminals 156 protrude beyond the dielectric layer 144 on the back side, and if such protrusion is not desired before the RDL 153 is formed, the protruding portions of the back side conductive terminals 156 may be rendered substantially planar with a surface of the dielectric layer 144 by known processes, such as grinding.

Figure 21:
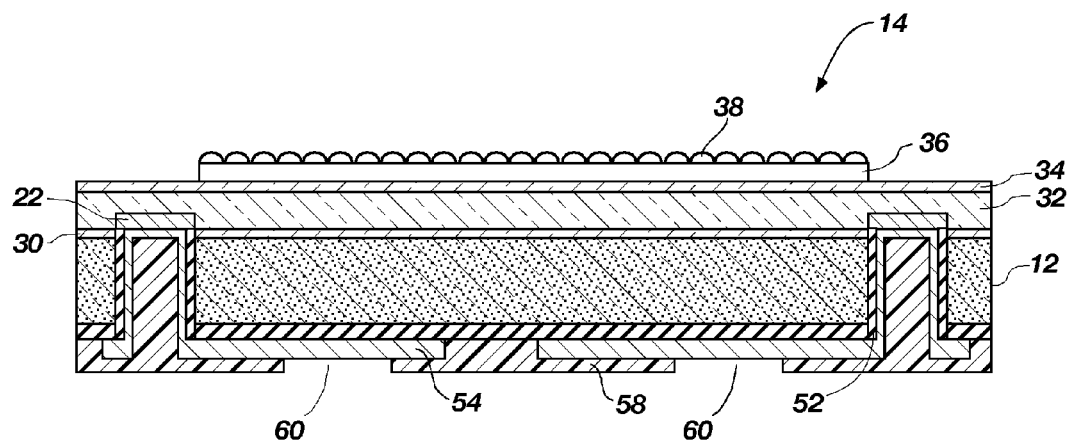
FIG. 21 illustrates the complete removal of protective layers from imaging features of the photoimager according to embodiments of the present invention.
Figure 22:
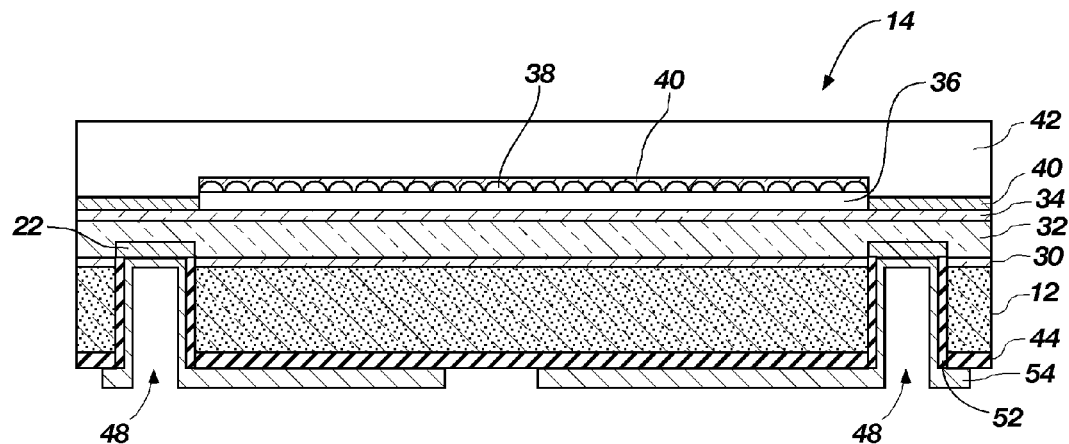
FIG. 22 illustrates the partial removal of protective layers from imaging features of the photoimager according to other embodiments of the present invention.

Referring now to FIG. 21, once conductive material has been introduced into the blind vias 48, 148 (FIG. 7), the back side conductive terminals 156 and an RDL 153, if any, have been formed, and, optionally, discrete conductive structures 162 have been formed or placed on contacts of any RDL 153, the protective layer 42 and the release layer 40 may be removed from the photoimager 14. The protective layer 42 and the release layer 40 may be removed in a number of ways, including, but not limited to, etching, peeling, dissolution, an ash process, or the like. The removal of the protective layer 42 and release layer 40 will be dictated by the type of material used for each layer and may be performed in one or more processes. In some embodiments, the release layer 42 or a portion thereof may remain on the microlenses 38, as shown in FIG. 22, forming a protective film (e.g., a low-silane oxide (LSO)), over the microlenses 38. Such a protective film may be of any suitable thickness (e.g., about 2000 angstroms thick or thicker).

Figure 23:
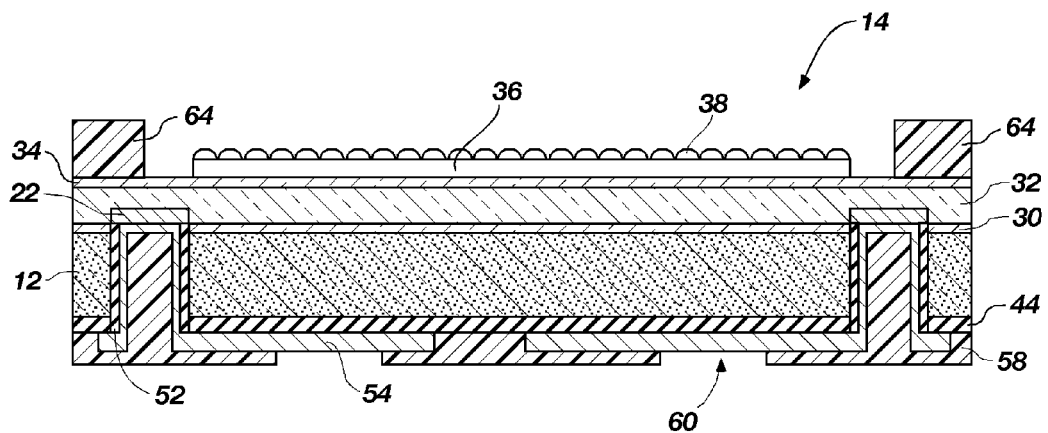
FIG. 23 shows the positioning of stand-offs over a non-sensing region of a sensing surface of a photoimager.

Once the protective layer 42 and at least a portion of the release layer 40 have been removed from the photoimager 14, in some embodiments of the present invention, standoffs 64 may be formed or secured to the photoimager 14, as shown in FIG. 23. Any known, suitable techniques may be used to form the standoffs 64 on the photoimager or to secure the standoffs 64 to the photoimager 14.

Figure 24:
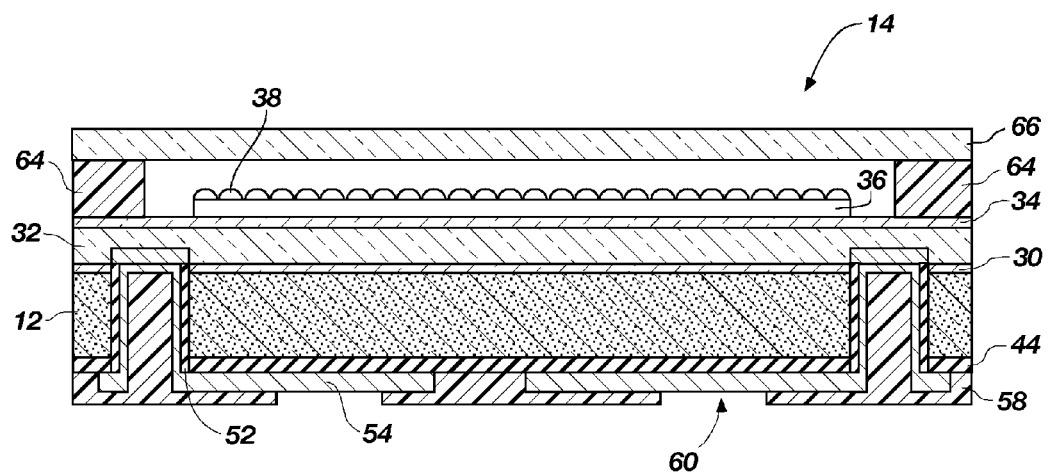
FIG. 24 depicts the placement of a transparent element against standoffs of the type shown in FIG. 23 and over sensing features of a photoimager.
Figure 25:
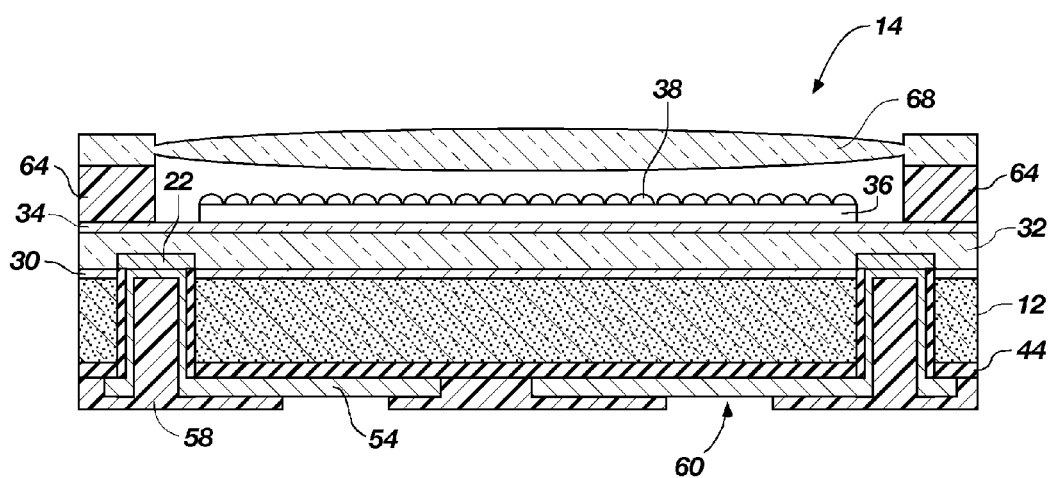
FIG. 25 illustrates the placement of a transparent element against standoffs of the type shown in FIG. 23 ad over sensing features of a photoimager.

The standoffs 64 may be configured to facilitate the positioning of glass 66, a lens 68, or one or more other optical elements over image sensing elements of the photoimager 14 in alignment with and spaced-apart relation to the image sensing elements of the photoimager 14, as shown in FIGS. 24 and 25, respectively.

As illustrated in FIG. 24, in some embodiments, once the standoffs 64 are in place, glass 66 may be positioned on the standoffs 64. The glass 66 may act as a cult-off filter to block the transmission of infrared radiation while allowing visible light. The glass 66 may be transmissive to ultraviolet light, infrared radiation, or other suitable spectrum according to the application of the photoimager. Suitable materials from which the glass 66 may be formed include, without limitation, glass, quartz, and polymers.

The glass 66 may be assembled with the photoimager 14 at the wafer level, before singulating or cutting individual photoimagers 14 from the fabrication substrate 10. As a result, the glass 66 may protect the microlenses 38 from particles that may be generated during the singulation process. Alternatively, pieces of glass 66 may be individually assembled with photoimagers 14.

Embodiments where a lens 68 is assembled with the photoimager are shown in FIG. 25. The lens 68 may direct the radiation or light which passes through it for focusing, or disperse/remove higher order detractions from the radiation or light. The lens 68 may include a curvature or a pin-hole aperture and may be formed from a glass, quartz, polymers, or other suitable materials. A wafer scale assembly of lenses 68 may be assembled with the photoimager 14 at the wafer level and, thus, assembly may be performed using automated fabrication equipment over all of the photoimagers 14 carried by the fabrication substrate 10 at substantially the same time. Alternatively, the lenses 68 may be individually assembled with the photoimagers 14 that are carried by a fabrication substrate 10.

While FIGS. 23-25 depict embodiments in which standoffs 64, glass 66, and lenses 68 are secured to photoimagers 14 that include an RDL 153 on the back side 20 thereof. In other embodiments, the standoffs 64, glass wafer 66, or lens 68 may also be formed on photoimagers 14 that lack RDLs 153.

Notably, and as evidenced by FIGS. 23-25, in some embodiments of the present invention, application of a solder, a molten metal material, or conductive or conductor-filled polymers, and similar conductive materials, as mentioned in reference to FIGS. 17 and 20, need not be effected before the assembly of glass 66, one or more lenses 68, or any other optical elements with photoimager 14.

Figure 26:
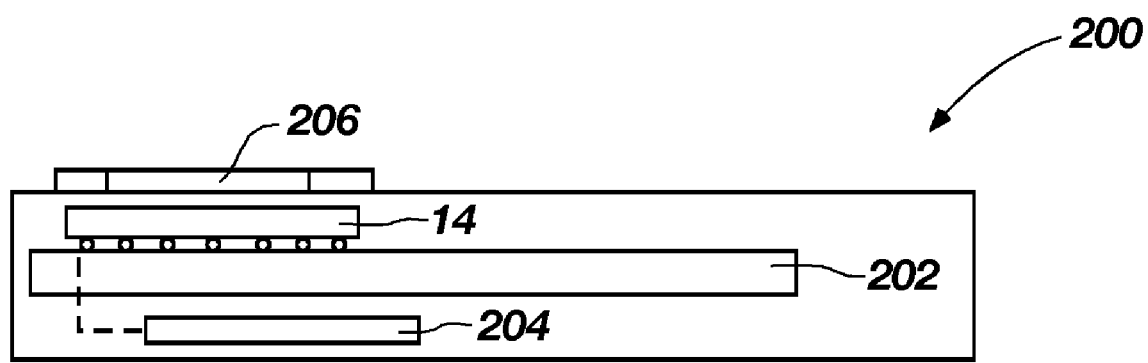
FIG. 26 is a schematic representation of an electronic device including a photoimager according to embodiments of the present invention.

With reference to FIG. 26, an electronic device 200 that includes a photoimager 14 according to embodiments of the present invention is depicted. Photoimager 14 is electrically connected to a carrier 202, such as a circuit board, that communicates with or carries other semiconductor devices 204, such as a processor, memory, and the like, as well as with a power source, input/output devices (e.g., wired and wireless communications ports, etc.), a video display, and a variety of other devices known in the art. In some embodiments, electronic device 200 may include one or more optical elements 206, such as glass 66 (FIG. 24), one or more lenses 68 (FIG. 25), filters, or the like. Without limiting the scope of the present invention, in specific embodiments, the electronic device 200 may comprise a camera, a cellular telephone, a personal digital assistant (PDA), or the like.

Although the foregoing description contains many specifics, these are not to be construed as limiting the scope of the present invention, but merely as providing certain representative embodiments. Similarly, other embodiments of the invention can be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed:

1. A method for packaging a photoimager, comprising:
    forming at least one protective layer at least over image sensing elements comprising optical features on an active surface of a photoimager;
    forming a release layer over the image sensing elements, wherein the at least one protective layer is formed over the release layer and wherein forming the release layer comprises forming the release layer from at least one of a low temperature oxide and a polymer;
    forming at least one blind via through a back side of the photoimager to an underside of a bond pad carried by the active surface of the photoimager; and
    removing the at least one protective layer and a portion of the release layer after forming the at least one protective layer, wherein removing the at least one protective layer and the portion of the release layer comprises leaving a protective film over the optical features of the photoimager.

2. The method of claim 1, wherein forming the at least one protective layer includes forming the at least one protective layer over at least one of a color filter array and an array of microlenses.

3. The method of claim 1, wherein forming the at least one protective layer comprises forming the at least one protective layer from at least one of a polymer, a metal, an oxide, and a ceramic.

4. The method of claim 1, wherein forming the at least one blind via comprises at least one of laser ablation and etching.

5. The method of claim 1, wherein forming the at least one blind via includes lining surfaces of at least one blind via hole with dielectric material.

6. The method of claim 5, wherein forming the at least one blind via further includes introducing conductive material into the at least one blind via hole, onto the dielectric material.

7. The method of claim 6, wherein introducing conductive material comprises forming at least one of an adhesion layer, a seed layer, and a barrier layer on the dielectric material within the at least one blind via hole.

8. The method of claim 7, wherein introducing conductive material further comprises forming at least one additional layer of conductive material over the at least one of the adhesion layer, the seed layer, and the barrier layer.

9. The method of claim 7, wherein introducing conductive material comprises introducing at least one of a solder, a molten metal material, a conductive polymer and a conductor-filled polymer into the at least one blind via hole.

10. The method of claim 7, further comprising:
coating the back side of the photoimager with dielectric material.

11. The method of claim 10, further comprising:
forming redistribution circuitry over the dielectric material on the back side of the photoimager.

12. The method of claim 1, wherein removing the protective layer and the portion of the release layer comprises at least one of a lift-off process, use of an etchant, and peeling.

13. The method of claim 1, further comprising:
filling at least one void within the at least one blind via.

14. The method of claim 13, wherein filling the at least one void comprises filling the at least one void with dielectric material.

15. The method of claim 1, further comprising:
thinning the photoimager from the back side with the at least one protective layer in place over the active surface.

16. The method of claim 15, wherein thinning comprises thinning a substrate of the photoimager to a thickness of less than about 100 μm.

* * * * *